United States Patent
Ahn et al.

(10) Patent No.: US 9,666,733 B2
(45) Date of Patent: May 30, 2017

(54) SOLAR CELL USING PRINTED CIRCUIT BOARD

(71) Applicants: Hyeon Woo Ahn, Daejeon (KR); Sung Gue Lee, Gyeonggi-do (KR)

(72) Inventors: Hyeon Woo Ahn, Daejeon (KR); Sung Gue Lee, Gyeonggi-do (KR)

(*) Notice: Subject to any disclaimer, the term of this patent is extended or adjusted under 35 U.S.C. 154(b) by 439 days.

(21) Appl. No.: 14/018,141

(22) Filed: Sep. 4, 2013

(65) Prior Publication Data
US 2015/0059843 A1    Mar. 5, 2015

(51) Int. Cl.
| | |
|---|---|
| *H01L 31/042* | (2014.01) |
| *H01L 31/0224* | (2006.01) |
| *H01L 31/0236* | (2006.01) |
| *H01L 31/0352* | (2006.01) |
| *H01L 31/048* | (2014.01) |
| *H01L 31/05* | (2014.01) |
| *H01L 31/068* | (2012.01) |

(52) U.S. Cl.
CPC ........ *H01L 31/022441* (2013.01); *H01L 31/02363* (2013.01); *H01L 31/03529* (2013.01); *H01L 31/035281* (2013.01); *H01L 31/048* (2013.01); *H01L 31/0516* (2013.01); *H01L 31/068* (2013.01); *Y02E 10/547* (2013.01)

(58) Field of Classification Search
CPC ....... H01L 31/022441; H01L 31/02363; H01L 31/035281; H01L 31/03529; H01L 31/048; H01L 31/0516; H01L 31/068
USPC ............................................. 136/242–265
See application file for complete search history.

(56) References Cited

U.S. PATENT DOCUMENTS

| | | | | |
|---|---|---|---|---|
| 4,521,640 A | * | 6/1985 | Levine | ............ H01L 31/035281 |
| | | | | 136/250 |
| 4,582,588 A | * | 4/1986 | Jensen | .................. C25D 11/08 |
| | | | | 136/250 |

(Continued)

FOREIGN PATENT DOCUMENTS

| | | |
|---|---|---|
| EP | 1102332 A2 | 5/2001 |
| EP | 1102332 A3 | 8/2002 |

(Continued)

OTHER PUBLICATIONS

European search report in corresponding European application No. 13182960.8 dated Mar. 4, 2014.

*Primary Examiner* — Matthew Martin
*Assistant Examiner* — Kourtney S Carlson
(74) *Attorney, Agent, or Firm* — Jonathan A. Kidney; TechLaw LLP

(57) ABSTRACT

A solar cell using a printed circuit board (PCB) includes a substrate that is formed of an insulating material and in and through which a plurality of fixing holes and communication holes are alternately formed; a plurality of photoelectric effect generators that have ball or polyhedral shapes fixed to the substrate to be disposed over the plurality of fixing holes, and generate photoelectric effects by receiving light through light-receiving portions that are exposed to an upper portion of the substrate; a plurality of upper electrodes that are formed on a top surface of the substrate, and are connected to the respective light-receiving portions of the photoelectric effect generators; and a plurality of lower electrodes that are formed on a bottom surface of the substrate to be connected to respective non-light-receiving portions of the photoelectric effect generators, and communicate with the plurality of upper electrodes through the plurality of communication holes.

10 Claims, 3 Drawing Sheets

(56) References Cited

U.S. PATENT DOCUMENTS

| | | | |
|---|---|---|---|
| 6,706,959 B2* | 3/2004 | Hamakawa | H01L 31/042 136/250 |
| 2004/0140001 A1 | 7/2004 | Hammerbacher | |
| 2010/0065863 A1 | 3/2010 | Ray | |
| 2010/0101627 A1* | 4/2010 | Patel | H01L 31/035281 136/244 |
| 2011/0114157 A1* | 5/2011 | Meissner | H01L 31/022425 136/250 |
| 2011/0204330 A1* | 8/2011 | LeMieux | B82Y 10/00 257/15 |
| 2011/0259406 A1* | 10/2011 | Levy | B32B 17/10018 136/251 |
| 2012/0118353 A1* | 5/2012 | Fishler | F24J 2/05 136/248 |

FOREIGN PATENT DOCUMENTS

| | | |
|---|---|---|
| EP | 1445804 A1 | 8/2004 |
| EP | 2551929 A1 | 1/2013 |
| EP | 2610919 A1 | 7/2013 |
| JP | U57-2675 | 6/1980 |
| JP | 2001-210843 | 8/2001 |
| JP | 2005-123391 | 5/2005 |
| JP | 2006-237543 | 9/2006 |
| JP | 2006-344616 | 12/2006 |
| JP | 2007-059923 | 3/2007 |
| JP | 2009-211978 | 9/2009 |
| JP | 2009-295545 | 12/2009 |
| JP | 2012-080040 | 4/2012 |
| JP | 2012-109414 | 6/2012 |
| JP | 2012-234854 | 11/2012 |
| JP | 2012-253275 | 12/2012 |
| JP | 2013-008753 | 1/2013 |
| JP | 2013-098353 | 5/2013 |
| JP | 2013-139390 | 7/2013 |
| KR | 101045273 | 6/2011 |
| KR | 101325572 | 11/2013 |
| WO | WO 03056633 A1 | 7/2003 |
| WO | 2010/070714 A1 | 6/2010 |
| WO | WO 2011105283 A1 | 9/2011 |

* cited by examiner

SOLAR CELL USING PRINTED CIRCUIT BOARD

BACKGROUND

1. Field of the Invention

The present invention relates to a solar cell having a structure using a printed circuit board (PCB) and a silicon ball.

2. Discussion of Related Art

A solar cell which is a device for converting energy of light into electricity generates electricity using two types of semiconductors, that is, a P-type semiconductor and an N-type semiconductor. When light is applied to a solar cell, electrons and holes are generated in the solar cell. Charge carriers such as the electrons and the holes move to P and N poles, and a potential difference (photovoltaic power) is generated between the P pole and the N pole. In this case, when a load is connected to the solar cell, current starts flowing, which is called a photoelectric effect.

A silicon solar cell that is generally used in a current solar photovoltaic power generation system has a structure including a silicon wafer substrate, an upper electrode, and a lower electrode. The silicon wafer substrate has a P-N junction between a P-layer and an N-layer. In general, an upper layer of the silicon wafer substrate is formed as the N-layer and a lower layer of the silicon wafer substrate is formed as the P-layer. An upper electrode and an anti-reflection film are formed on a top surface of the N-layer, and a lower electrode is formed on a bottom surface of the P-layer. When light is applied to the solar cell having the structure, charge carriers such as electrons and holes are generated in the solar cell, and among the charge carriers, the electrons move toward an N-type semiconductor and the holes move toward a P-type semiconductor. The charge carriers moving to the N- and P-type semiconductors move to electrodes, and thus current starts flowing.

The solar cell constructed as described above has problems in that a light-receiving area is reduced since light is covered by the upper electrode, and in a solar cell module, efficiency is reduced due to conductive resistance of a ribbon that connects cells. In order to improve photoelectric conversion efficiency, there have been attempts to increase a light-receiving area by reducing a line width of an upper electrode and to reduce reflection loss by reducing a reflectance of a solar cell. In addition to such attempts, various studies have been made to reduce solar cell manufacturing costs.

SUMMARY OF THE INVENTION

The present invention is directed to a solar cell having a new structure that may increase a light-receiving area using a photoelectric effect generator having a ball or polyhedral shape and may reduce manufacturing costs using a printed circuit board (PCB) structure.

According to an aspect of the present invention, there is provided a solar cell using a printed circuit board (PCB), the solar cell including: a substrate that is formed of an insulating material and in and through which a plurality of fixing holes and communication holes are alternately formed; a plurality of photoelectric effect generators that have ball or polyhedral shapes fixed to the substrate to be disposed over the plurality of fixing holes, and generate photoelectric effects by receiving light through light-receiving portions that are exposed to an upper portion of the substrate; a plurality of upper electrodes that are formed on a top surface of the substrate, and are connected to the respective light-receiving portions of the photoelectric effect generators; and a plurality of lower electrodes that are formed on a bottom surface of the substrate to be connected to respective non-light-receiving portions of the photoelectric effect generators, and communicate with the plurality of upper electrodes through the plurality of communication holes.

Each of the plurality of photoelectric effect generators may include P-type silicon or N-type silicon, and a diffusion layer having a P-N junction is formed on a surface of the light-receiving portion of the photoelectric effect generator.

A surface of each of the plurality of photoelectric effect generators may have a textured shape. A coating layer coated with an anti-reflection material may be formed on a surface of each of the plurality of photoelectric effect generators.

Each of the plurality of upper electrodes may include: a connection portion that is formed to define each of the plurality of fixing holes and is connected to each of the light-receiving portions of the photoelectric effect generators; a first extension portion that extends in a first direction from the connection portion; and an upper communication portion that is formed on an end portion of the first extension portion to define each of the plurality of communication holes.

Each of the plurality of lower electrodes may include: a filled portion that is filled in the fixing hole and is connected to the non-light-receiving portion of the photoelectric effect generator; a second extension portion that extends in a second direction, which is opposite to the first direction, from the filled portion; and a lower communication portion that is formed on an end portion of the second extension portion to define the communication hole.

An insulating member for insulating the connection portion and the filled portion may be formed in the fixing hole.

The solar cell may further include an anti-reflection film that is formed by coating an anti-reflection material on the top surface of the substrate. The solar cell may further include: a glass plate that is disposed on a top surface of the anti-reflection film; and a carbon nanotube (CNT)-coating layer that is formed on a top surface of the glass plate, and includes a CNT material.

The solar cell may further include a thermal diffusion film that is stacked on the bottom surface of the substrate, and diffuses heat of the substrate.

The solar cell may further include at least one circuit board that is disposed on the bottom surface of the substrate, and includes a circuit pattern that is electrically connected to each of the plurality of lower electrodes.

Air holes through which air passes to reduce wind resistance may be formed in and through the substrate.

The objects and configurations of the solar cell using the PCB according to the present invention will become more apparent from the detailed description of the exemplary embodiments of the present invention based on the attached drawings.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings.

Figure 1:
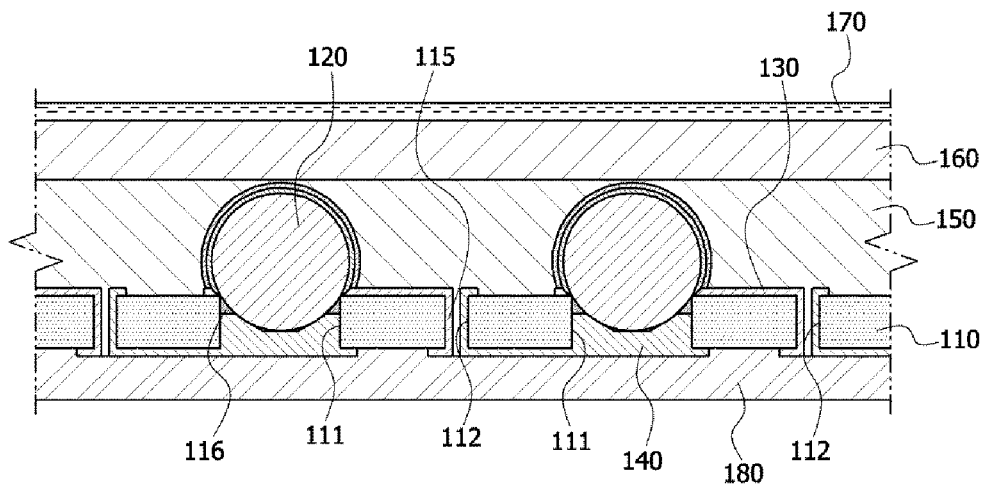
FIG. 1 is a cross-sectional view illustrating a solar cell using a printed circuit board (PCB) according to an embodiment of the present invention.
Figure 2:
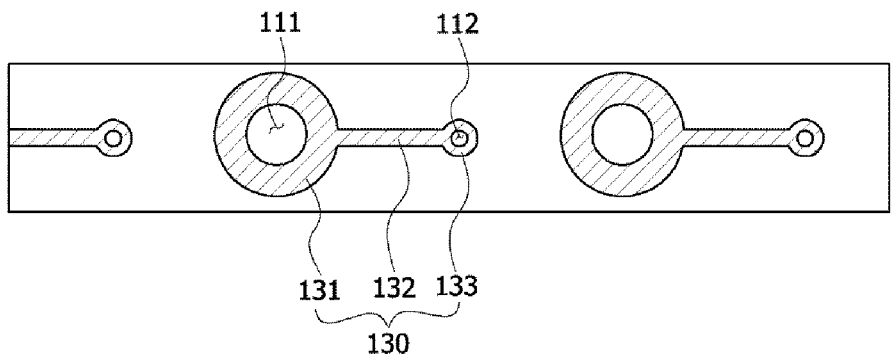
FIG. 2 is a plan view illustrating a substrate of FIG. 1.
Figure 3:
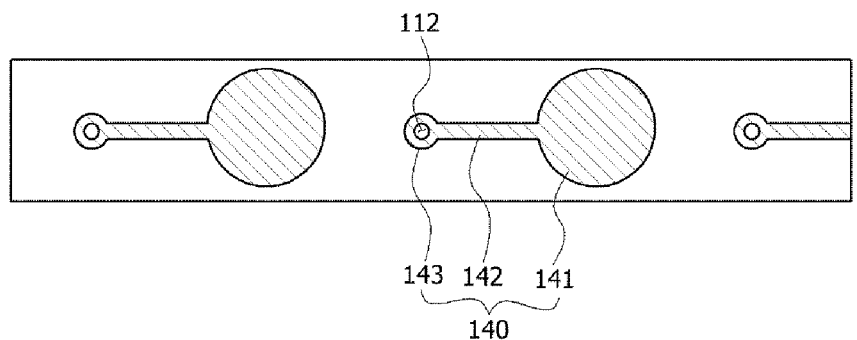
FIG. 3 is a rear view illustrating the substrate of FIG. 1.

FIG. 1 is a cross-sectional view illustrating a solar cell using a printed circuit board (PCB) according to an embodiment of the present invention. FIG. 2 is a plan view illustrating a substrate 110 of FIG. 1. FIG. 3 is a rear view illustrating the substrate 110 of FIG. 1.

Referring to FIGS. 1 through 3, the solar cell includes the substrate 110 formed of an insulating material, a plurality of photoelectric effect generators that are provided on the substrate 110, a plurality of upper electrodes 130 that are formed on a top surface of the substrate 110, and a plurality of lower electrodes 140 that are formed on a bottom surface of the substrate 110.

A substrate used for a general PCB is used as the substrate 110 formed of an insulating material. The substrate 110 may be formed of a material such as an epoxy resin, a phenolic resin, or a polyimide.

A plurality of fixing holes 111 and communication holes 112 are alternately formed in and through the substrate 110. The fixing holes 111 and the communication holes 112 are alternately formed in a specific direction. The fixing holes 111 provide spaces for communicating silicon balls 120 and the lower electrodes 140, and the communication holes 112 provide spaces for communicating the upper electrodes 130 and the lower electrodes 140.

The photoelectric effect generators are fixed to the substrate 110 and function to generate photoelectric effects when receiving light. Each of the photoelectric effect generators may be formed of a semiconductor material capable of generating a photoelectric effect, for example, silicon or gallium arsenide (GaAs).

In FIGS. 1 through 3, the photoelectric effect generator has a ball or polyhedral shape in order to increase a light-receiving portion. The term "ball shape" used herein encompasses a shape having a curved outer surface such as a spherical shape and an oval shape. The term "polyhedral shape" used herein refers to a three-dimensional shape bounded by flat surfaces such as a tetrahedral shape, a pentahedral shape, a hexahedral shape, an octahedral shape, or a dodecahedral shape.

The photoelectric effect generator may have a structure formed of a semiconductor material capable of generating a photoelectric effect, or may have a structure formed by coating a semiconductor material capable of generating a photoelectric effect on a ball or polyhedral outer surface of an insulating material (for example, plastic or glass). In the latter structure, examples of the semiconductor material coated on the ball or polyhedral outer surface may include silicon, CdTe, and CIGS.

The following explanation will be made on the assumption that the photoelectric effect generator is formed of silicon and has a ball shape, and the 'photoelectric effect generator' will be referred to as the 'silicon ball' 120 for convenience of explanation. Accordingly, descriptions of the silicon ball 120 may apply to another type of photoelectric effect generator.

The plurality of silicon balls 120 are fixed to the substrate 110 to be disposed over the fixing holes 111. The silicon balls 120 may be fixed to the substrate 110 by being partially inserted into the respective fixing holes 111, and have diameters greater than diameters of the fixing holes 111. The silicon balls 120 generate photoelectric effects by receiving light through portions (hereinafter referred to as 'exposed portions') that are exposed to an upper portion of the substrate 110. Configurations of the silicon balls 120 will be explained below in detail.

Although the silicon balls 120 are inserted into the fixing holes 111 in FIGS. 1 through 3, the present embodiment is not limited thereto and the silicon balls 120 may not be inserted into the fixing holes 111 according to shapes and sizes of the photoelectric effect generators. For example, when the photoelectric effect generators have polyhedral shapes having sizes greater than those of the fixing holes 111, the photoelectric effect generators may be fixed to the substrate 110 to cover the fixing holes 111.

The plurality of upper electrodes 130 are formed on the top surface of the substrate 110, and are connected to respective light-receiving portions (that is, the exposed portions) of the silicon balls 120. Referring to FIG. 2, each of the upper electrodes 130 may include a connection portion 131, a first extension portion 132, and an upper communication portion 133.

The connection portion 131 is formed to define each of the fixing holes 111 and is connected to the light-receiving portion of each of the silicon balls 120. The connection portion 131 may be formed to have a ring shape, and is electrically connected to the silicon ball 120 by contacting the light-receiving portion of the silicon ball 120.

The first extension portion 132 extends in a first direction (rightward in FIG. 2) from the connection portion 131. The first extension portion 132 extends in the first direction from the connection portion 131 to reach each of the communication holes 112 that is far away from the connection portion 131 in the first direction.

The upper communication portion 133 is formed on an end portion of the first extension portion 132 to define the communication hole 112. The upper communication portion 133 may be formed to have a ring shape, like the connection portion 131.

The plurality of lower electrodes 140 are formed on the bottom surface of the substrate 110, and are connected to respective non-light-receiving portions that are inserted into the fixing holes 111 of the silicon balls 120. The lower electrodes 140 communicate with the upper electrodes 130 through the communication holes 112 and are electrically connected in series to the respective silicon balls 120.

Referring to FIG. 3, each of the lower electrodes 140 includes a filled portion 141, a second extension portion 142, and a lower communication portion 143.

The filled portion 141 is filled in each of the fixing holes 111 and is connected to the non-light-receiving portion of each of the silicon balls 120. The filled portion 141 is formed by filling a conductive material in the fixing hole 111.

An insulating member 116 for insulating the connection portion 131 and the filled portion 141 may be formed in the fixing hole 111.

The second extension portion 142 extends in a second direction (that is opposite to the first direction, leftward in FIG. 3) from the filled portion 141, to reach the communication hole 112 that is far away from the filled portion 141 in the second direction.

The lower communication portion 143 is formed on an end portion of the second extension portion 142 to define the communication hole 112. The lower communication portion 143 may be formed to have a ring shape like the upper communication portion 133, and is connected to the upper communication portion 133 of the upper electrode 130 through a plating layer 115 that is formed on an inner wall of the communication hole 112.

Each of the upper electrode 130 and the lower electrode 140 may be formed of a conductive material such as copper or silver, and may be formed using the same method as that used to form a general circuit pattern of the PCB. In the above configuration, the light-receiving portion of the silicon ball 120 is electrically connected to the lower electrode 140 that is far away in the first direction through the upper electrode 130, and the non-light-receiving portion of the silicon ball 120 is electrically connected to the upper electrode 130 that is far away in the second direction through the lower electrode 140.

An anti-reflection film 150 is formed by coating an anti-reflection material (for example, a fluorine-based resin, nanoparticles, $SiO_2$, or $TiO_2$) on the top surface of the substrate 110, and an over-coating layer 180 formed of an insulating material is formed on the bottom surface of the substrate 110 to protect the lower electrode 140.

A light-transmitting plate 160 formed of a light-transmitting material through which light is transmitted (for example, glass) is disposed on a top surface of the anti-reflection film 150 to protect the upper electrode 130. A carbon nanotube (CNT)-coating layer 170 including a CNT material may be formed on a top surface of the light-transmitting plate 160. The CNT-coating layer 170 reduces a reflectance so that a maximum amount of light is transmitted to the silicon ball 120.

A thermal diffusion film for diffusing heat of the substrate 110 may be additionally stacked on the bottom surface of the substrate 110. The thermal diffusion film functions to emit heat of the substrate 110 to the outside, and may be attached to a bottom surface of the over-coating layer 180 when the over-coating layer 180 is included.

In the solar cell constructed as described above, since light is absorbed using the silicon ball 120, a light-receiving area may be greater than that of a conventional flat panel solar cell. Since the upper electrode 130 is disposed under the silicon ball 120, the problem that light is covered by the upper electrode 130 may be solved. In addition, since the solar cell may be manufactured using a method of manufacturing a circuit pattern of a PCB, a manufacturing process may be simplified and manufacturing costs may be reduced.

Figure 4:
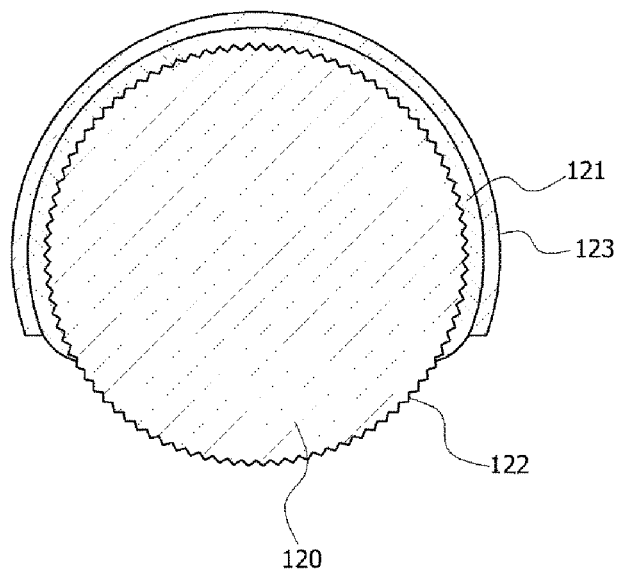
FIG. 4 is an enlarged cross-sectional view illustrating a silicon ball of FIG. 1.

FIG. 4 is an enlarged cross-sectional view illustrating the silicon ball 120 of FIG. 1.

The silicon ball 120 includes P-type silicon or N-type silicon, and a diffusion layer 121 having a P-N junction is formed on a surface of the light-receiving portion of the silicon ball 120. The silicon ball 120 may additionally include a P-type or N-type dopant.

In FIG. 4, the silicon ball 120 is formed of P-type silicon, and the diffusion layer 121 that is an N-type layer is formed on a surface of the silicon ball 120. In this case, the diffusion layer 121 may be formed by diffusing $POCl_3$ or $H_3PO_4$ including group V elements in the silicon ball 120 formed of P-type silicon at a high temperature and performing a doping process. The doping process may be performed in a state where the silicon ball 120 is attached to the substrate 110. In this case, a $POCl_3$ layer or a $H_3PO_4$ layer is additionally formed on the substrate 110.

Although the silicon ball 120 is formed of silicon in FIG. 4, the silicon ball 120 may be formed by coating silicon on an insulating ball.

The connection portion 131 of the upper electrode 130 contacts the diffusion layer 121 and an N pole, and the filled portion 141 of the lower electrode 140 is connected to a P pole of the silicon ball 120. When light is applied to the silicon ball 120, electrons and holes are generated in the silicon ball 120, and the electrons move toward the diffusion layer 121 and the upper electrode 130 and the holes move toward the lower electrode 140, thereby causing current to start flowing.

A surface of the silicon ball 120 may have a textured shape 122 in order to reduce reflectance, and a coating layer 123 coated with an anti-reflection material may be additionally formed on the surface of the silicon ball 120. Since the textured surface is formed on the silicon ball 120, the coating layer 123 for anti-reflection is formed on the surface of the silicon ball 120, and the CNT-coating layer 170 is formed on the light-transmitting plate 160, reflection loss may be greatly reduced.

Figure 5:
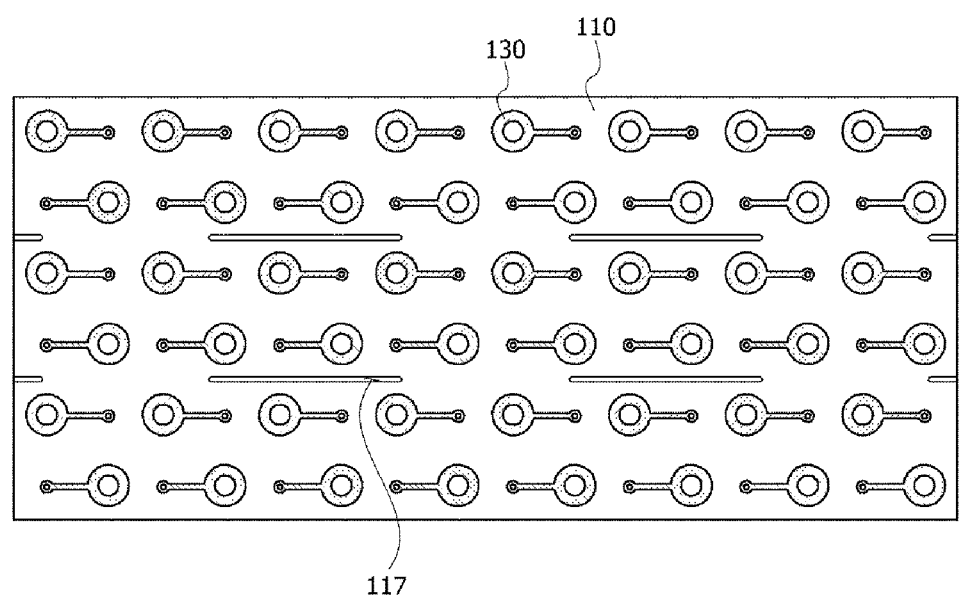
FIG. 5 is a plan view illustrating the substrate on which upper electrodes are arranged.
Figure 6:
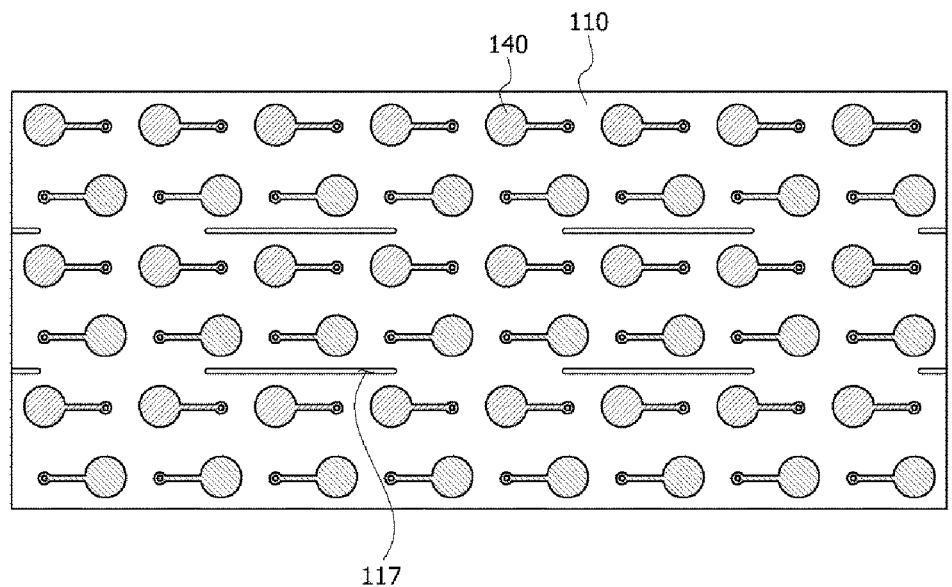
FIG. 6 is a rear view illustrating the substrate on which lower electrodes are arranged.

FIG. 5 is a plan view illustrating the substrate 110 on which the upper electrodes 130 are arranged. FIG. 6 is a rear view illustrating the substrate 110 on which the lower electrodes 140 are arranged.

Referring to FIGS. 5 and 6, the upper electrodes 130 are arranged to form a plurality of columns, and the lower electrodes 140 are arranged to correspond to the upper electrodes 130. The present embodiment is not limited thereto, and the solar cell may be manufactured to have any of various other structures according to pattern shapes and arrangements of the upper electrodes 130.

In particular, unlike a conventional silicon solar cell including a solar cell module that is formed by connecting a plurality of cells, the solar cell according to the present invention may be manufactured to have any of various areas according to an area of the substrate 110 and the number of the silicon balls 120. Also, since a ribbon for connecting cells is not required, power loss that occurs due to conductive resistance of the ribbon may be avoided.

A plurality of air holes 117 through which air passes in order to reduce wind resistance may be formed in and through the substrate 110. The air holes 117 may vertically pass through the top and bottom surfaces of the substrate 110, and thus wind may pass through the top and bottom surfaces of the substrate 110. Although the air holes 117 having slit shapes are formed at predetermined intervals in FIGS. 5 and 6, shapes and the number of the air holes 117 may be variously changed.

Figure 7:
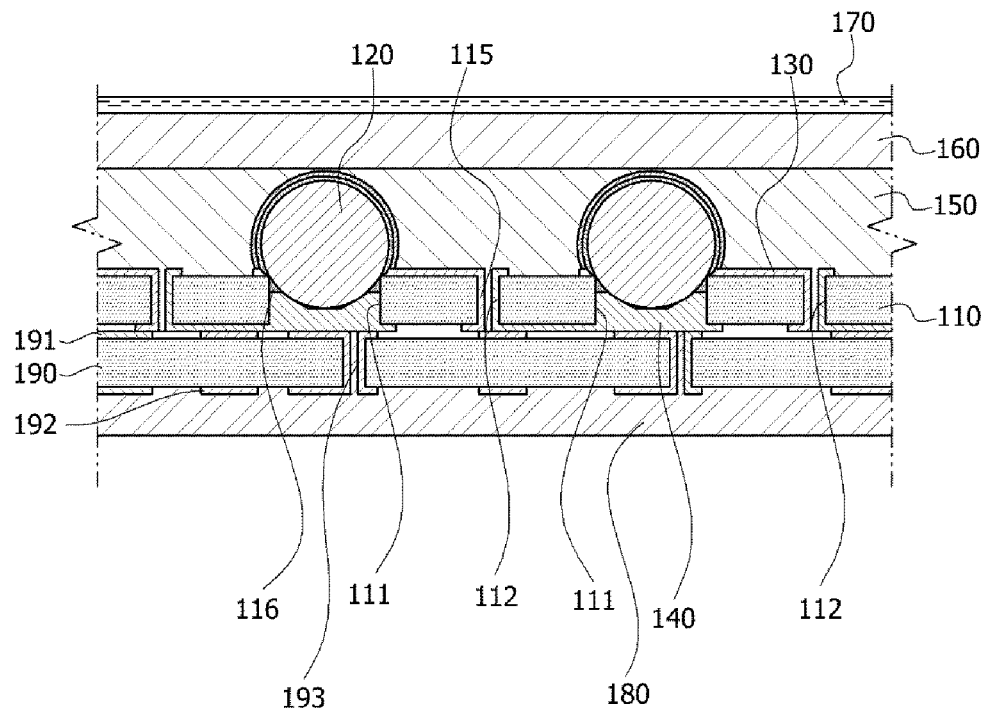
FIG. 7 is a cross-sectional view illustrating a solar cell using a PCB according to another embodiment of the present invention.

FIG. 7 is a cross-sectional view illustrating a solar cell using a PCB according to another embodiment of the present invention.

The solar cell of FIG. 7 additionally includes a circuit board 190 for performing a specific function when compared to the solar cell of the previous embodiment. The circuit board 190 is disposed on the bottom surface of the substrate 110, and includes upper and lower circuit patterns 191 and 192 that are electrically connected to the lower electrode 140.

As such, since the solar cell of FIG. 7 has a PCB structure, the solar cell may have an integrated structure by stacking the circuit board 190 having a specific function. For example, when the solar cell is connected to an energy storage system (ESS), the circuit board 190 may be provided with a function of connecting the solar cell and the ESS and converting a signal.

The upper pattern 191 and the lower pattern 192 are respectively provided on a top surface and a bottom surface of the circuit board 190 in FIG. 7. Accordingly, the upper pattern 191 and the lower pattern 192 communicate with each other through a plating layer 193 that is formed on an inner wall of a communication hole. The circuit board 190 is not limited thereto, and a shape and the number of the circuit board(s) 190 added to the solar cell may be variously changed. For example, the circuit board 190 may be formed as a single layer, or two or more circuit boards 190 may be stacked as multiple layers.

As described above, according to a solar cell of the present invention constructed as described above, since light is absorbed using a photoelectric effect generator having a ball or polyhedral shape, a light-receiving area may be greater than that of a conventional flat panel solar cell, and since an upper electrode is disposed under the photoelectric effect generator, the problem that light is covered by the upper electrode may be solved.

Also, since the solar cell may be manufactured using a method of manufacturing a circuit pattern of a PCB, a manufacturing process may be simplified and manufacturing costs may be reduced.

Reflection loss may be greatly reduced due to a textured structure formed on a surface of a silicon ball, an anti-reflection coating layer of the silicon ball, and a CNT-coating layer of a glass plate.

Also, the solar cell may be manufactured to have any of various areas according to an area of a substrate and the number of silicon balls. Since a ribbon for connecting cells in not required, power loss that occurs due to conductive resistance of the ribbon may be avoided.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A solar cell using a printed circuit board (PCB), the solar cell comprising:
a substrate that is formed of an insulating material, and formed as a continuous flat single layer, and in and through which a plurality of fixing holes and communication holes are alternately formed, wherein the fixing holes and communication holes have a form of a through-hole penetrating a top and a bottom surface of the substrate;
a plurality of photoelectric effect generators that have a ball shape fixed to the substrate to be disposed over the plurality of fixing holes, and generate photoelectric effects by receiving light through light-receiving portions that are exposed to an upper portion of the substrate, wherein each photoelectric effect generator of the plurality of photoelectric effect generators are alternately spaced in a substantially linear direction at a fixed distance between the communication holes to form an alternating photoelectric effect generator and communication hole arrangement;
a plurality of upper electrodes that are patterned on the top surface of the substrate, and are connected to the respective light-receiving portions of the photoelectric effect generators; and
a plurality of lower electrodes that are patterned on the bottom surface of the substrate to be connected to respective non-light-receiving portions of the photoelectric effect generators, and communicate with the plurality of upper electrodes through the plurality of communication holes, wherein each of the plurality of upper electrodes comprises:
a connection portion that is formed to define each of the plurality of fixing holes and is connected to each of the light-receiving portions of the photoelectric effect generators by contacting with each of the light-receiving portions;
a first extension portion that extends in a first direction from the connection portion; and
an upper communication portion that is formed on an end portion of the first extension portion to define each of the plurality of communication holes,
wherein each of the plurality of lower electrodes comprises:
a filled portion that is filled in the fixing hole and is connected to the non-light-receiving portion of the photoelectric effect generator;
a second extension portion that extends in a second direction, which is opposite to the first direction, from the filled portion; and
a lower communication portion that is formed on an end portion of the second extension portion to define the communication hole, wherein the lower communication portion of the lower electrode is connected to the upper communication portion of the upper electrode through a plating layer on the inner wall of the communication hole, wherein the plating layer implements a series interconnection between neighboring photoelectric effect generators of the plurality of photoelectric effect generators.

2. The solar cell of claim 1, wherein each of the plurality of photoelectric effect generators comprises P-type silicon or N-type silicon, and a diffusion layer having a P-N junction is formed on a surface of the light-receiving portion of the photoelectric effect generator.

3. The solar cell of claim 1, wherein a surface of each of the plurality of photoelectric effect generators has a textured shape.

4. The solar cell of claim 1, wherein a coating layer coated with an anti-reflection material is formed on a surface of each of the plurality of photoelectric effect generators.

5. The solar cell of claim 1, wherein an insulating member for insulating the connection portion and the filled portion is formed in the fixing hole.

6. The solar cell of claim 1, further comprising an anti-reflection film that is formed by coating an anti-reflection material on the top surface of the substrate.

7. The solar cell of claim 6, further comprising:
a glass plate that is disposed on a top surface of the anti-reflection film; and
a carbon nanotube (CNT)-coating layer that is formed on a top surface of the glass plate, and comprises a CNT material.

8. The solar cell of claim 1, further comprising a thermal diffusion film that is stacked on the bottom surface of the substrate, and diffuses heat of the substrate.

9. The solar cell of claim 1, further comprising at least one circuit board that is disposed on the bottom surface of the substrate, and comprises a circuit pattern that is electrically connected to each of the plurality of lower electrodes.

10. The solar cell of claim 1, wherein air holes through which air passes to reduce wind resistance are formed in and through the substrate.

* * * * *